United States Patent
Chen

(10) Patent No.: US 7,358,663 B2
(45) Date of Patent: *Apr. 15, 2008

(54) ORGANIC LIGHT-EMITTING DIODE

(75) Inventor: Jui-Hsing Chen, Taoyuan County (TW)

(73) Assignee: AU Optronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/684,137

(22) Filed: Mar. 9, 2007

(65) Prior Publication Data

US 2007/0145890 A1    Jun. 28, 2007

Related U.S. Application Data

(63) Continuation of application No. 10/883,102, filed on Jul. 1, 2004, now Pat. No. 7,205,714.

(30) Foreign Application Priority Data

Apr. 19, 2004    (TW) ................. 93110824 A

(51) Int. Cl.
    *H05B 33/00*    (2006.01)
(52) U.S. Cl. ............... 313/504; 313/504; 313/506; 313/501

(58) Field of Classification Search .......... None
See application file for complete search history.

(56) References Cited

U.S. PATENT DOCUMENTS

| 6,590,346 B1 | 7/2003 | Hadley et al. |
| 6,787,976 B2 | 9/2004 | Minoura et al. |
| 6,984,934 B2 | 1/2006 | Moller et al. |
| 2003/0117067 A1 | 6/2003 | Roitman et al. |
| 2003/0141805 A1 | 7/2003 | Lee et al. |

FOREIGN PATENT DOCUMENTS

| JP | 2004127560 | 4/2004 |
| TW | 578438 | 3/2004 |
| WO | WO03007663 | 1/2003 |

*Primary Examiner*—Ashok Patel
(74) *Attorney, Agent, or Firm*—Thomas, Kayden, Horstemeyer & Risley

(57) ABSTRACT

An organic light-emitting diode and method of fabricating the same. The organic light-emitting diode includes a substrate having a plurality of protrusions on a first plane thereof, a first electrode installed on a second plane of the substrate, wherein the second plane is opposed to the first plane, an organic light-emitting layer installed on the first electrode, and a second electrode installed on the organic light-emitting layer.

6 Claims, 8 Drawing Sheets

ORGANIC LIGHT-EMITTING DIODE

CROSS REFERENCE TO RELATED APPILCATIONS

This application is a Continuation of pending U.S. patent application Ser. No. 10/883,102, filed Jul. 1, 2004 now U.S. Pat. No. 7,205,714 and entitled "Organic Light-Emitting Diode".

BACKGROUND OF THE INVENTION

1. Field of the Invention

The present invention relates to an optoelectrical device, and more specifically to an organic light-emitting display and a method of fabricating the same.

2. Description of the Related Art

According to Snell's law $n_1 * \sin \theta_1 = n_2 * \sin \theta_2$ (wherein $n_1$ represents the refractive index of high-refractive materials, $n_2$ represents the refractive index of low-refractive materials, $\theta_1$ represents the incident angle of light, $\theta_2$ represents the refractive angle of light), the total reflection of light may happen when light is transmitted from higher refractive index material to lower, for example, from glass or dielectric layer to the air. This is because the incident angle ($\theta_1$) of some light in the higher refractive index ($n_1$) material is far enough over a critical angle so as to create light having a 90° refractive angle ($\theta_2$), wherein some incident light cannot enter the lower refractive index ($n_2$) material.

For an organic light-emitting diode (OLED) featuring self-illumination, some inner light in a pixel cannot be emitted due to the total reflection phenomenon, resulting in light consumption and reduced illumination efficiency. Additionally, when aluminum (Al) is used for a cathode of an OLED, gray level or contrast may be reduced, owing to reflective light from the aluminum and glass plane in the presence of exterior light. Currently, although a polarizer is used to reduce the exterior light effect, it may reduce the inner light transmittance, deteriorating illumination efficiency.

In the related art, an OLED structure is disclosed, for example, in U.S. Pat. No. 6,366,017, and in FIG. 1. Referring to FIG. 1, a substrate 10 is provided. An anode 12, an emissive layer 13, and a transparent conducting layer 14 are formed on the substrate 10 in order. After the emissive layer 13 produces light, some light passes through the transparent conducting layer 14, and other remains, forming total reflection, and resulting in the reduction of light transmittance, and deterioration of element efficiency. To solve this problem, a Distributed Bragg Reflector (DBR) 15 is installed on the transparent conducting layer 14 in the related art to reduce total reflection, increasing element performance to obtain sufficient light source, improving brightness.

Nevertheless, DBR 15 may focus light at specific angles causing the exterior glare, deteriorating the quality of gray level or contrast, and further increasing the process cost.

SUMMARY OF THE INVENTION

In order to solve the conventional problems, an object of the invention is to provide an OLED to reduce the total reflection and exterior glare, improving element performance thereof.

The OLED structure provided in the invention includes a substrate having a plurality of protrusions on a first plane thereof, a first electrode installed on a second plane of the substrate, wherein the second plane is opposed to the first plane, an organic light-emitting layer installed on the first electrode, and a second electrode installed on the organic light-emitting layer.

The protrusions formed on the substrate in the present invention are defined by photomask patterns, and may be arced, trapezoidal, or rectangular, and have proper sizes. Detailed characteristics of the protrusions are described in the subsequent embodiments. Referring to FIG. 2, the protrusions 20 formed on the substrate surface can decrease the incident angle $\theta_1$ and refractive angle $\theta_2$ to reduce the total reflection of inner light, improving light transmittance. Additionally, after exterior light reaches the uneven protrusion surfaces, it presents uniform scatter phenomenon to avoid exterior glare.

Another object of the invention is to provide a method of fabricating an OLED, including the following steps. A substrate is provided. A patterned resist layer is formed on a first plane of the substrate. Subsequently, the substrate is defined to form a plurality of protrusions. A first electrode is then formed on a second plane of the substrate, wherein the second plane is opposed to the first plane. Next, an organic light-emitting layer is formed on the first electrode. Finally, a second electrode is formed on the organic light-emitting layer.

The present invention provides another method of fabricating an OLED, including the following steps. A substrate is provided. A dielectric layer is formed on a first plane of the substrate. Subsequently, the dielectric layer is defined to form a plurality of protrusions. A first electrode is then formed on a second plane of the substrate, wherein the second plane is opposed to the first plane. Next, an organic light-emitting layer is formed on the first electrode. Finally, a second electrode is formed on the organic light-emitting layer.

In the present invention, the protrusions facilitating light transmittance are directly fabricated on the substrate. Compared to the related art, requiring installation of an additional DBR, the invention provides a simpler and lower-cost process. In addition, the scatter effect of elements can be improved without extra fabrication process.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3c-1 is a cross section of an OLED in the first embodiment of the invention.

FIG. 3c-2 is a cross section of an OLED in the first embodiment of the invention.

FIG. 4b-1 is a cross section of an OLED in the second embodiment of the invention.

FIG. 4b-2 is a cross section of an OLED in the second embodiment of the invention.

DETAILED DESCRIPTION OF THE INVENTION

First Embodiment

Figure 3A:
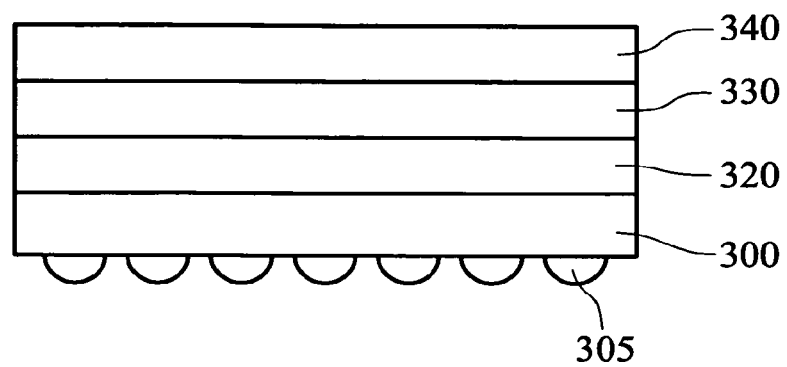
FIGS. 3a~3b are cross sections of the method of fabricating an OLED in the first embodiment of the invention.
Figure 3B:
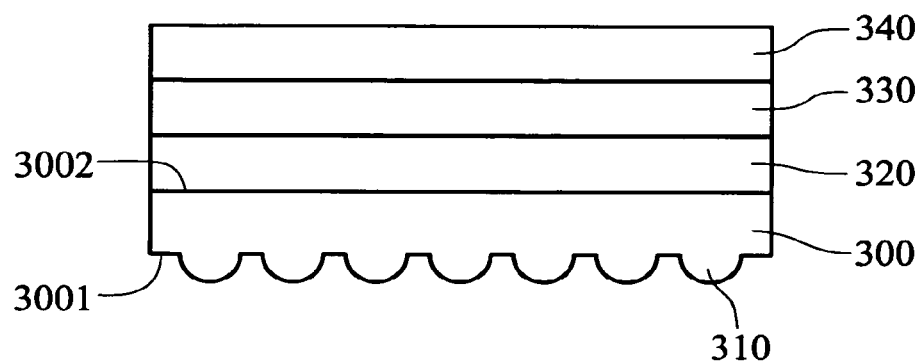

FIGS. 3a~3b are cross sections of the method of fabricating the OLED according to the first embodiment of the invention. First, referring to FIG. 3a, a substrate 300 is provided. The substrate 300 includes a transparent glass substrate or plastic substrate, wherein the plastic substrate is composed of polyethyleneterephthalate, polyester, polycarbonates, polyimide, arton, polyacrylates, or polystyrene.

Next, a patterned resist layer 305 with, for example, an arced cross section, is formed on a first plane 3001 of the substrate 300, and other cross-sectional patterns are trapezoidal or rectangular, wherein arced cross section is preferable. Subsequently, the substrate 300 is defined to form a plurality of protrusions 310 on the first plane 3001 thereof with the patterned resist layer 305 used as an etching mask. The patterned resist layer 305 is then removed, as shown in FIG. 3b.

Figure 1:
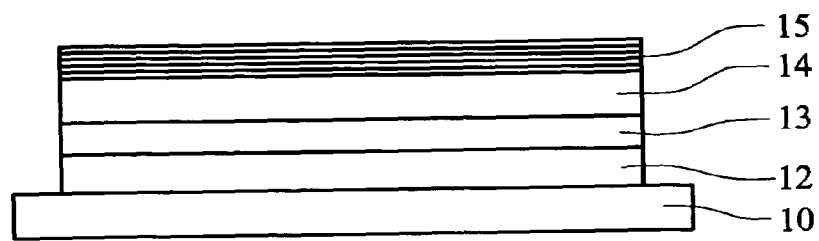
FIG. 1 is a cross section of an OLED in U.S. Pat. No. 6,366,017.
Figure 2:
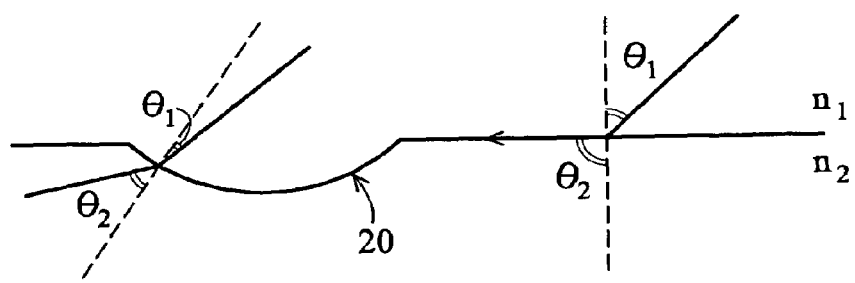
FIG. 2 illustrates inner light passing through the uneven surface of the protrusion and the even surface of the substrate in an embodiment of the invention.
Figures 1, 3C:
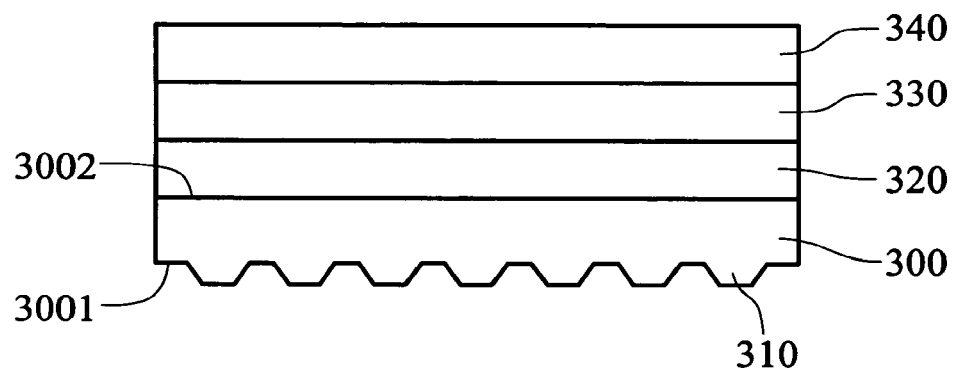
Figures 2, 3C:
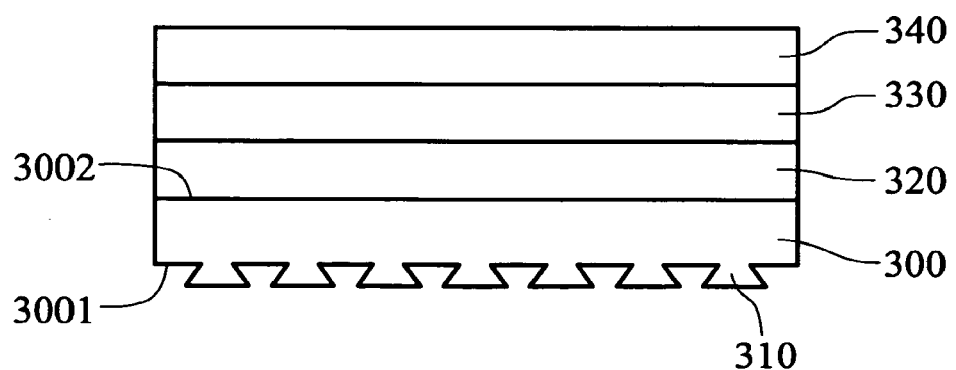
Figure 3D:
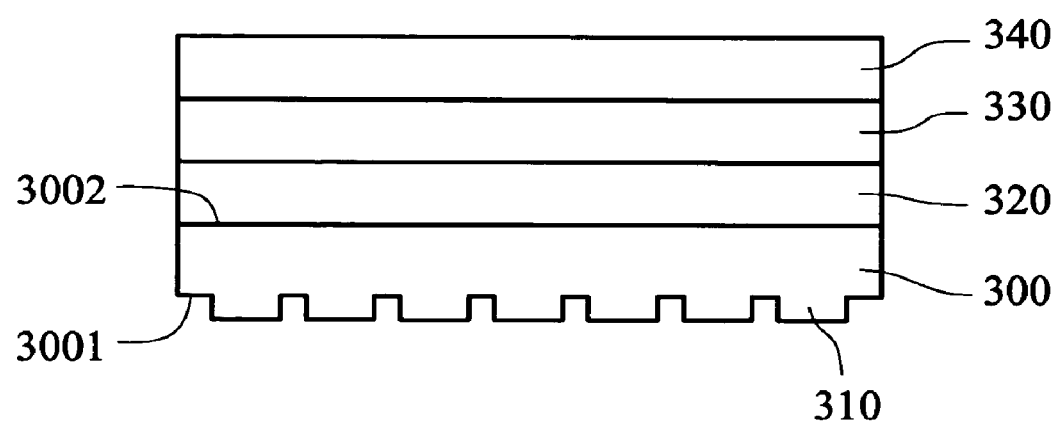
FIG. 3d is a cross section of an OLED in the first embodiment of the invention.

Detailed characteristics of protrusions, such as size, shape, or function are described as follows. The height of the protrusions 310 is about 4000~8000 Å, preferably 6000 Å. The width of the protrusions 310 is about 3000~7000 Å, preferably 5000 Å. Cross-sections of the protrusions 310 can be arced, trapezoidal, or rectangular (shown in FIG. 3d), preferably arced, wherein the contact angle between the arced structure and the substrate 300 is not greater than 90°, preferably 45°, the top of the trapezoidal is wider than the bottom thereof, or the opposite (shown in FIG. 3c-1 and 3c-2).

The protrusion 310 belongs to a microlens, and its refractive index is altered with various substrate materials, preferably 1.3~1.9. The transmittance of inner light is increased to about above 10% by the refractive lenses of the protrusions 310, improving scatter phenomenon of inner or exterior light at the protrusion surfaces simultaneously. Etching forming the protrusions 310 uses wet HF etching. The concentration of etching solution is about 2.5%. The etching temperature is about 25° C. The etching time is about 6~10 min to control the expected size, including the height and width of the protrusions 310.

Subsequently, a first electrode 320 is formed on a second plane 3002 of the substrate 300, wherein the second plane 3002 is opposed to the first plane 3001. The first electrode is a transparent electrode, and may comprise indium tin oxide (ITO), indium zinc oxide (IZO), aluminum zinc oxide (AZO), or zinc oxide (ZnO), preferably ITO.

Next, an organic light-emitting structural layer is formed on the first electrode 320, comprising an electron-transport layer (not shown), an organic light-emitting layer 330, and a hole-transport layer (not shown) in order. The organic light-emitting layer 330 includes single or multiple organic illuminative layers. The organic illuminative materials comprise micromolecules or macromolecules of fluorescent or phosphorescent materials, wherein the micromolecule organic illuminative materials covering the first electrode 320 are formed by vacuum evaporation, and the macromolecule organic illuminative materials are formed by spin-on, ejection, or screen printing.

Subsequently, a second electrode 340 is formed on the organic light-emitting layer 330. The second electrode 340 includes a transparent, metallic, or complex electrode, wherein the complex electrode is composed of multiple electrode layers, and the metal electrode is Li, Mg, Ca, Al, Ag, In, Au, Ni, Pt, or combinations thereof, further the complex electrode is Li, Mg, Ca, Al, Ag, In, Au, Ni, Pt, ITO, IZO, AZO, or ZnO.

Second Embodiment

Figure 4A:
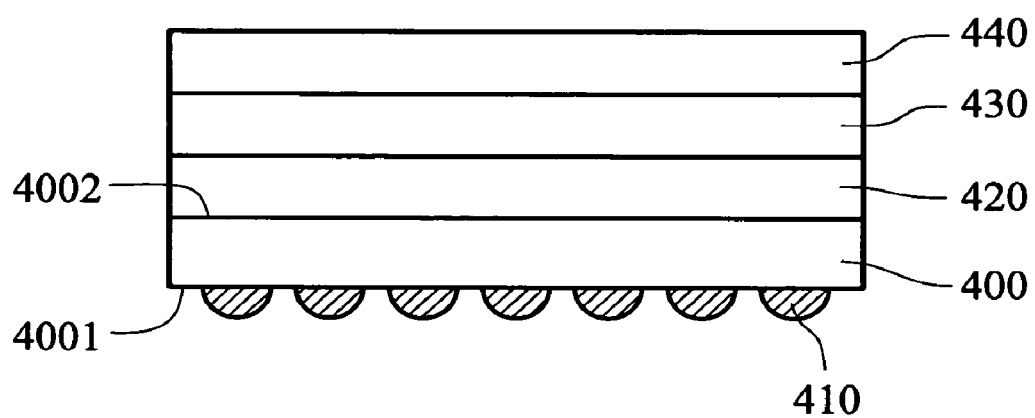
FIG. 4a is a cross section of the method of fabricating an OLED in the second embodiment of the invention.

FIGS. 4a is a cross sections of the method of fabricating the OLED according to the second embodiment of the invention. First, referring to FIG. 4a, a substrate 400 is provided. The substrate 400 includes a transparent glass substrate or plastic substrate, wherein the plastic substrate is composed of polyethyleneterephthalate, polyester, polycarbonates, polyimide, arton, polyacrylates, or polystyrene.

Next, a dielectric layer 410 is formed on a first plane 4001 of the substrate 400. The dielectric layer 410 is a transparent material, comprising silicon oxide, silicon nitride, or silicon oxide nitride. The refractive index of the dielectric layer 410 is altered with various substrate materials, about 1.3~1.9, preferably 1.5. The thickness of the dielectric layer 410 is about 4000~8000 Å, preferably 6000 Å. The dielectric layer 410 is formed by deposition, being a predetermined region of the subsequently formed protrusions.

Next, a patterned resist layer (not shown) is formed on the dielectric layer 410. The cross-sectional patterns of the pattern resist layer may be arced, trapezoidal, or rectangular, preferably arced. Subsequently, the dielectric layer 410 is defined to form a plurality of protrusions 410 with the patterned resist layer used as an etching mask. The patterned resist layer is then removed.

Figures 1, 4B:
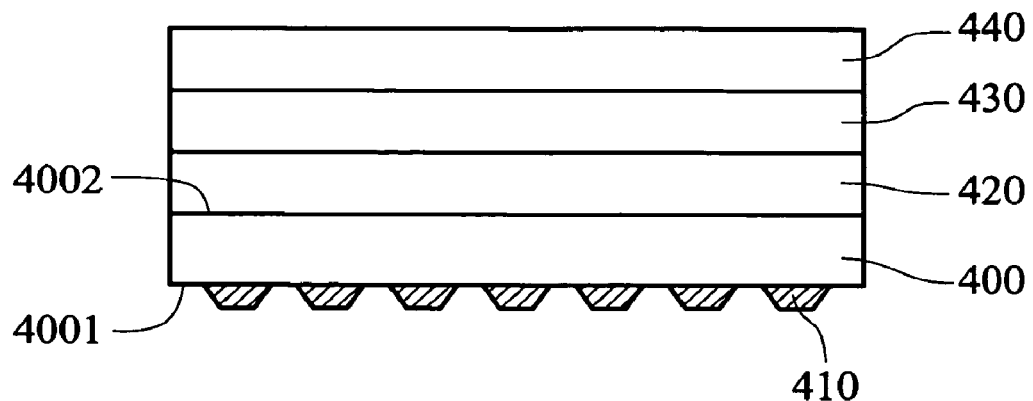
Figures 2, 4B:
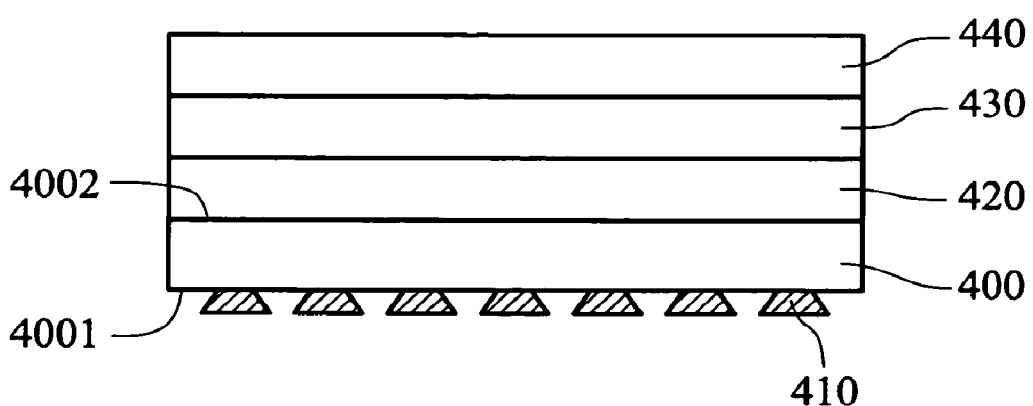
Figure 4C:
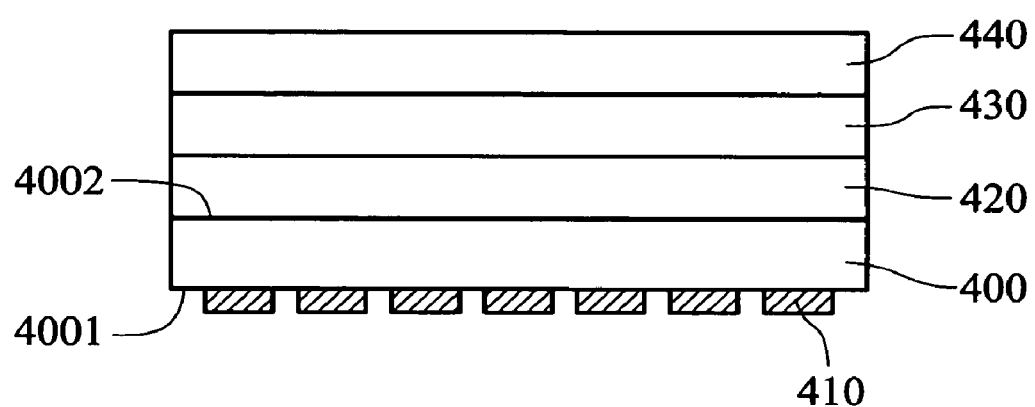
FIG. 4c is a cross section of an OLED in the second embodiment of the invention.

Detailed characteristics of protrusions, such as size, shape, or function are described as follows. The height of the protrusions 410 is about 4000~8000 Å, preferably, 6000 Å. The width of the protrusions 410 is about 3000~7000 Å, preferably 5000 Å. Cross sections of the protrusions 410 can be arced, trapezoidal, or rectangular (shown in FIG. 4c), preferably arced, wherein the contact angle between the arced structure and the substrate 400 is not greater than 90°, preferably 45°, the top of the trapezoidal is wider than the bottom thereof, or the opposite (shown in FIG. 4b-1 and 4b-2).

Protrusions 410 are microlenses. The transmittance of inner light is increased to about above 10% by the refractive lenses of the protrusions 410, improving scatter phenomenon of inner or exterior light at the protrusion surfaces simultaneously. Etching forming the protrusions 410 is performed by dry etching, such as inductively coupled plasma (ICP) or reactive ion etch (RIE).

The etching temperature is about 40° C. Etching pressure is about 5~100 mtorr. The etching time is about 6 min to control the expected size, including the height and width of the protrusions 410, and the etching power is about 100~1500 W.

Subsequently, a first electrode 420 is formed on a second plane 4002 of the substrate 400, wherein the second plane 4002 is opposed to the first plane 4001. The first electrode 420 is a transparent electrode, and may comprise indium tin oxide (ITO), indium zinc oxide (IZO), aluminum zinc oxide (AZO), or zinc oxide (ZnO), preferably ITO.

Next, an organic light-emitting structural layer is formed on the first electrode 420, comprising an electron-transport layer (not shown), an organic light-emitting layer 430, and a hole-transport layer (not shown) in order. The organic light-emitting layer 430 includes single or multiple organic illuminative layers. The organic illuminative materials comprise micromolecules or macromolecules of fluorescent or phosphorescent materials, wherein the micromolecule organic illuminative materials covering the first electrode 420 are formed by vacuum evaporation, and the macromolecule organic illuminative materials are formed by spin-on, ejection, or screen printing.

Subsequently, a second electrode 440 is formed on the organic light-emitting layer 430. The second electrode 440 includes a transparent, metallic, or complex electrode, wherein the complex electrode is composed of multiple electrode layers, and the metal electrode is Li, Mg, Ca, Al, Ag, In, Au, Ni, Pt, or combinations thereof, and further the complex electrode is Li, Mg, Ca, Al, Ag, In, Au, Ni, Pt, ITO, IZO, AZO, or ZnO.

Figure 5:
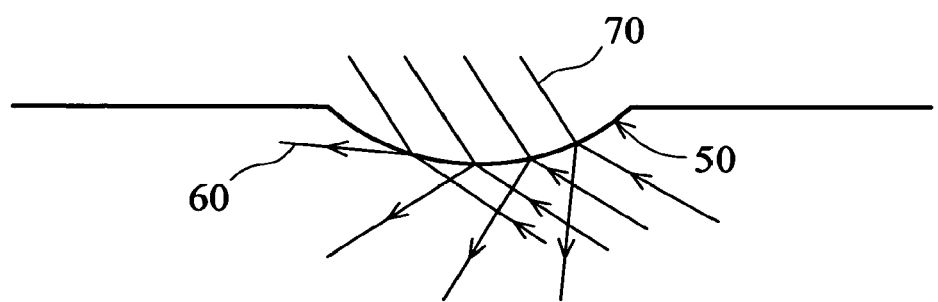
FIG. 5 illustrates scatter phenomenon of exterior light passing through the protrusion surface in an embodiment of the invention.

Referring to FIG. 5 and, 3 or 4, the incident angle of inner light is decreased to reduce the total reflection due to the protrusion structures (310 or 410) of the substrate (300 or 400) when inner light reaches the surfaces 50, improving illumination efficiency. Further, the scatter phenomenon 60 of exterior light reaching the surfaces 50 is formed, and exterior light passing through the substrate (300 or 400) have not been parallel light 70, as shown in FIG. 5, after reflection from the cathode, and refraction from the surfaces 50 of the substrate (300 or 400), also producing scatter phenomenon to reduce glare.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic light-emitting diode, comprising:

a substrate, having a plurality of arced protrusions on a first plane thereof, wherein the refractive index of the arced protrusions is 1.3-1.9 such that the transmittance of an inner light is increased to about above 10% by the arced protrusions;

a first electrode, installed on a second plane of the substrate, wherein the second plane is opposed to the first plane;

an organic light-emitting layer, installed on the first electrode; and a second electrode, installed on the organic light-emitting layer.

2. The organic light-emitting diode as claimed in claim 1, wherein the height of the protrusions is about 4000~8000 Å.

3. The organic light-emitting diode as claimed in claim 1, wherein the width of the protrusions is about 3000~7000 Å.

4. The organic light-emitting diode as claimed in claim 1, wherein the contact angle between the arced protrusion and the substrate is not greater than about 90°.

5. The organic light-emitting diode as claimed in claim 1, wherein the height of the protrusions is about 4000~8000 Å, and the width of the protrusions is about 3000~7000 Å.

6. An organic light-emitting diode, comprising:

a substrate, having a plurality of arced protrusions on a first plane thereof, wherein the height of the protrusions is about 4000~8000 Å, and the width of the protrusions is about 3000~7000 Å;

a first electrode, installed on a second plane of the substrate, wherein the second plane is opposed to the first plane;

an organic light-emitting layer, installed on the first electrode; and a second electrode, installed on the organic light-emitting layer.

* * * * *